(12) United States Patent
Khanna et al.

(10) Patent No.: US 9,310,409 B2
(45) Date of Patent: *Apr. 12, 2016

(54) CAPACITANCE-TO-VOLTAGE INTERFACE CIRCUITS

(71) Applicant: Freescale Semiconductor Inc., Austin, TX (US)

(72) Inventors: Ashish Khanna, Maricopa, AZ (US); Sung Jin Jo, Gilbert, AZ (US)

(73) Assignee: FREESCALE SEMICONDUCTOR INC., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/282,152

(22) Filed: May 20, 2014

(65) Prior Publication Data

US 2014/0253148 A1    Sep. 11, 2014

Related U.S. Application Data

(60) Division of application No. 13/344,415, filed on Jan. 5, 2012, now Pat. No. 8,766,650, which is a continuation of application No. 12/360,932, filed on Jan. 28, 2009, now Pat. No. 8,125,231.

(51) Int. Cl.
*G01R 27/26* (2006.01)
*G01D 5/24* (2006.01)
*G01P 15/125* (2006.01)

(52) U.S. Cl.
CPC .............. *G01R 27/2605* (2013.01); *G01D 5/24* (2013.01); *G01P 15/125* (2013.01)

(58) Field of Classification Search
CPC ... G01D 5/24; G01R 27/2605; G01R 31/2829
USPC .................................... 324/658–690
See application file for complete search history.

(56) References Cited

U.S. PATENT DOCUMENTS

| | | | |
|---|---|---|---|
| 6,529,015 B2 | 3/2003 | Nonoyama et al. | |
| 7,663,379 B2 | 2/2010 | Nehrig et al. | |
| 7,796,079 B2 | 9/2010 | Khanna et al. | |
| 7,969,167 B2 | 6/2011 | Khanna et al. | |
| 8,125,231 B2 | 2/2012 | Khanna et al. | |

*Primary Examiner* — Vincent Q Nguyen
(74) *Attorney, Agent, or Firm* — Ingrassia Fisher & Lorenz, P.C.

(57) ABSTRACT

A capacitance-to-voltage interface circuit is utilized to obtain a voltage corresponding to a detected capacitance differential, which may be associated with the operation of a capacitive sensing cell. The interface circuit includes a capacitive sensing cell, an operational amplifier adapted for selective coupling to the capacitive sensing cell, a feedback capacitor for the operational amplifier, a load capacitor for the operational amplifier, and a switching architecture associated with the capacitive sensing cell, the operational amplifier, the feedback capacitor, and the load capacitor. During use, the switching architecture reconfigures the capacitance-to-voltage interface circuit for operation in a plurality of different phases. The different operational phases enable the single operational amplifier to be used for both capacitance-to-voltage conversion and voltage amplification.

20 Claims, 6 Drawing Sheets

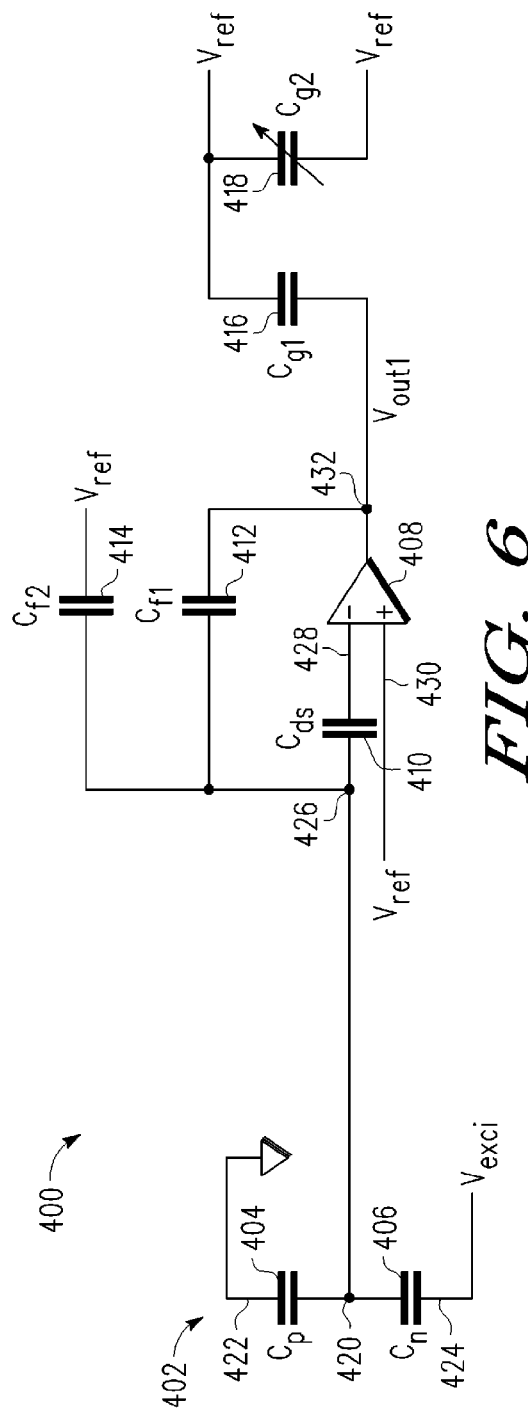
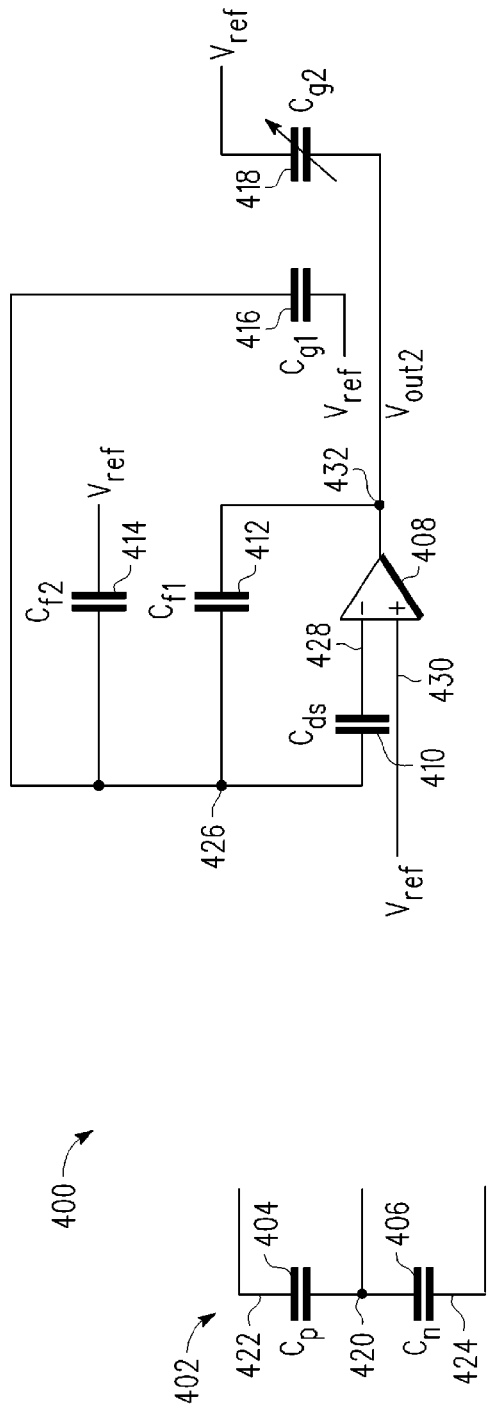
FIG. 6
FIG. 7

CAPACITANCE-TO-VOLTAGE INTERFACE CIRCUITS

RELATED APPLICATIONS

This application is a divisional of U.S. patent application Ser. No. 13/344,415, filed on Jan. 5, 2012, which is a continuation of U.S. patent application Ser. No. 12/360,932 (filed on Jan. 28, 2009, and issued on Feb. 28, 2012 as U.S. Pat. No. 8,125,231). In addition, the subject matter described here is related to that described in: U.S. patent application Ser. No. 12/360,933 (filed on Jan. 28, 2009, and issued on Sep. 14, 2010 as U.S. Pat. No. 7,796,079); and U.S. patent application Ser. No. 12/360,934 (filed on Jan. 28, 2009, and issued on Jun. 28, 2011 as U.S. Pat. No. 7,969,167). The entire content of these related applications is incorporated by reference herein.

TECHNICAL FIELD

Embodiments of the subject matter described herein relate generally to electronic circuits. More particularly, embodiments of the subject matter relate to a sensor interface circuit that converts measured changes in capacitance into a voltage.

BACKGROUND

The prior art is replete with electronic sensors, transducers, and circuits that detect or measure physical phenomena. For example, an accelerometer can be realized as a miniature sensor component that detects movement, changes in physical orientation, vibration, shaking, or the like. Miniature accelerometers can be included in a variety of applications such as mobile devices, portable video games, and digital media players. An accelerometer in such a device can be used to detect whether the display of the device is oriented in a portrait mode or a landscape mode, to transition between sleep and active modes, to obtain user input (e.g., shaking the device might represent a user command), etc.

Accelerometers in portable devices are often implemented with capacitive sensing cells. In this context, a capacitive sensing cell includes a plurality of capacitors that are arranged and energized such that the capacitance of the cell varies with its acceleration. In typical applications, the measured difference in capacitance is converted into a voltage that can be processed or analyzed in an appropriate manner. In particular, a capacitance-to-voltage interface circuit can be used to convert the measured capacitance differential into a corresponding analog voltage. However, due to the relatively low voltage levels associated with such capacitance-to-voltage conversion, the analog voltage is usually amplified to provide adequate dynamic range for purposes of subsequent analog-to-digital conversion.

Conventional capacitance-to-voltage interface circuits utilize three primary elements or stages: a capacitive sensing cell; a first amplifier stage associated with the capacitance-to-voltage conversion; and a second amplifier stage associated with the analog voltage amplification. Notably, each amplifier stage includes at least one distinct operational amplifier device or circuit. Thus, at a minimum, the conventional architecture utilizes two distinct and separate operational amplifiers.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 6 is a circuit diagram that illustrates an embodiment of a capacitance-to-voltage interface circuit arranged in a final capacitance-to-voltage topology and configuration;

FIG. 7 is a circuit diagram that illustrates an embodiment of a capacitance-to-voltage interface circuit arranged in an initial amplification topology and configuration;

DETAILED DESCRIPTION

Figure 1:
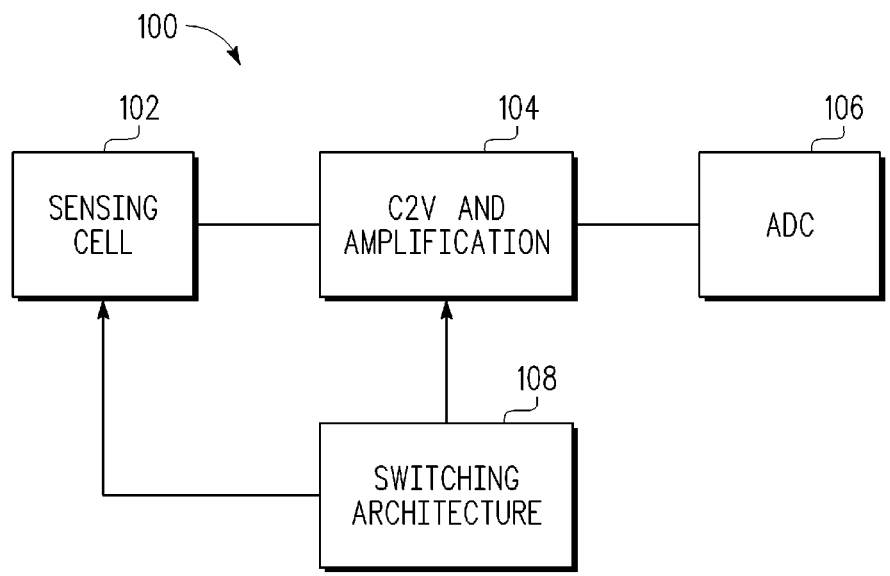
FIG. 1 is a simplified schematic representation of an embodiment of a capacitance-to-voltage interface circuit.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematics shown in the figures depict exemplary arrangements of elements, additional intervening elements, devices, features, or components may be present in an embodiment of the depicted subject matter.

The techniques and technologies described herein can be utilized with a capacitive sensing cell. Such sensing cells are commonly found in electronic sensors such as accelerometers, although the specific implementation and application of the capacitive sensing cell may vary from one embodiment to another. More specifically, the subject matter described herein relates to a reconfigurable capacitance-to-voltage interface circuit that includes only one operational amplifier for purposes of conversion and amplification. The use of only one operational amplifier in this context is desirable to reduce packaging size and to reduce power consumption of the host device or system, relative to conventional architectures that use two or more operational amplifier devices. Although such an implementation might function in an acceptable manner, the use of two or more operational amplifiers is undesirable from both a physical packaging standpoint and a power consumption standpoint. In this regard, it is usually desirable to decrease the integrated circuit die area and, consequently, the overall physical footprint of mobile devices. In addition, it is usually desirable to decrease the electrical current requirements and, therefore, increase the battery life of mobile devices. Accordingly, it is desirable to reduce the physical size and power consumption of capacitance-to-voltage interface circuits.

FIG. 1 is a simplified schematic representation of an embodiment of a capacitance-to-voltage interface circuit 100. This embodiment of circuit 100 generally includes, without limitation, a capacitive sensing cell 102, a module 104 that performs capacitance-to-voltage conversion and voltage amplification, an analog-to-digital converter (ADC) 106, and a reconfiguring or switching architecture 108. In some embodiments, capacitive sensing cell 102 is implemented as a distinct device or package, while the remainder of circuit 100 is implemented as an application specific integrated circuit (ASIC), which is coupled to capacitive sensing cell 102. For the sake of brevity, conventional techniques related to capacitive sensing, integrated circuit design, amplifier design and operation, and other functional aspects of the circuits (and the individual operating elements of the circuits) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the interface circuit.

Capacitive sensing cell 102 is suitably configured such that its capacitance is a function of its acceleration, motion, physical orientation, and/or other parameter to be measured. As described in more detail below, capacitive sensing cell 102 may be of conventional design, and it may include two capacitors in series. Switching architecture 108 is utilized to selectively couple capacitive sensing cell 102 to module 104 as needed and to rearrange, reconfigure, and/or establish different topologies for circuit 100 (explained in more detail below).

Module 104 preferably includes one and only one operational amplifier, along with various capacitors and possibly other circuit elements. Notably, module 104 is suitably configured to perform capacitance-to-voltage conversion operations in addition to related voltage amplification operations that result in an amplified output voltage that is indicative of the acceleration, movement, shaking, physical orientation, or vibration of the host device. For this embodiment, the amplified output voltage of module 104 is provided to ADC 106, which then converts the amplified output voltage into an equivalent digital representation. As explained further below, capacitors in ADC 106 are connected to module 104 in a switched manner as needed during operation. In other words, although FIG. 1 depicts ADC 106 connected to module 104, the link between these elements is only established as necessary. Operation of ADC 106 may follow well known principles, and the design, configuration, and function of ADC 106 will not be described in detail here. The bit resolution of ADC 106 can be chosen to suit the needs of the particular application.

Switching architecture 108 is associated with capacitive sensing cell 102, module 104, and ADC 106 in that it determines and influences the particular circuit topology and configuration of circuit elements in circuit 100 at any given time. Switching architecture 108 may be realized using any number of controllable switches or switching elements, such as transistor-based switches. The state, mode, or condition of each switch in switching architecture 108 is preferably controlled with suitable processor control logic (not shown). In this manner, a processor of the host device can be suitably programmed to control switching architecture 108 as needed to support the various operations described here. Notably, although FIG. 1 depicts switching architecture 108 as a distinct block, in reality switching architecture 108 can be implemented in a distributed manner throughout circuit 100. For example, one or more switches may be integrated with or coupled to capacitive sensing cell 102, a number of switches may reside "between" capacitive sensing cell 102 and module 104, one or more other switches may be integrated with or coupled to module 104, and still other switches may reside "between" module 104 and ADC 106. For simplicity and clarity, individual switching elements are neither illustrated nor described in detail here.

Figure 2:
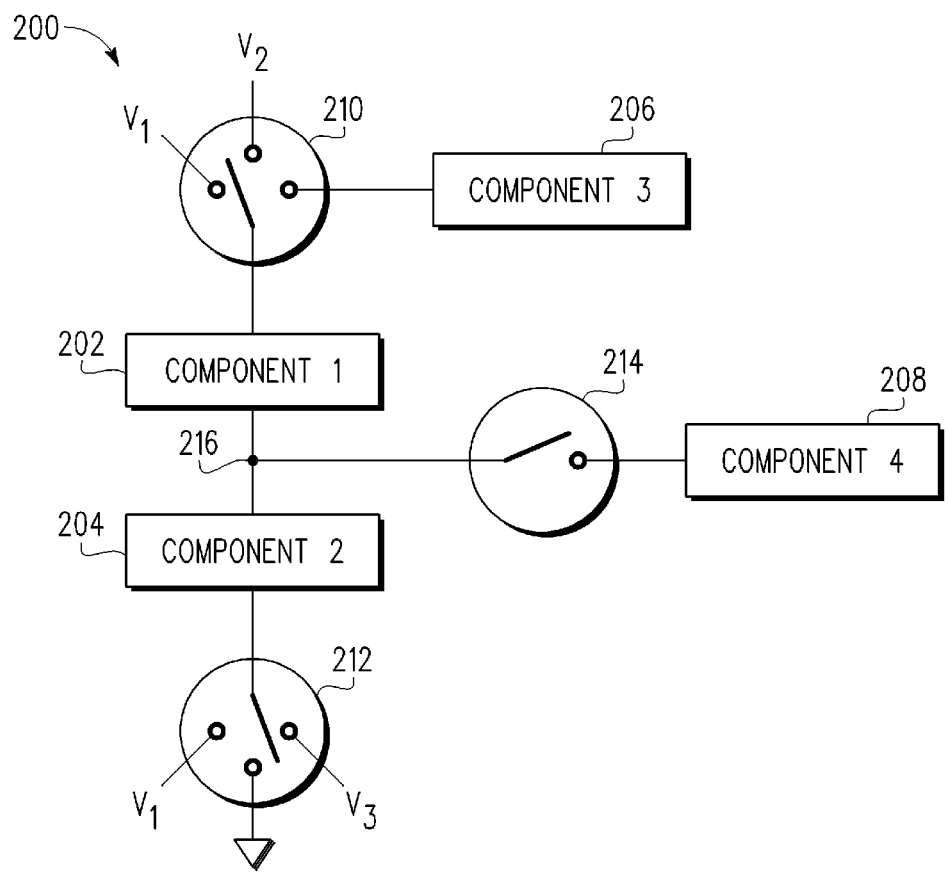
FIG. 2 is a diagram that illustrates electrical components that can be arranged and reconfigured into different circuit topologies using a switching architecture.

The manner in which switching architecture 108 operates will be described with reference to FIG. 2, which is a diagram that illustrates electrical components 200 that can be arranged and reconfigured into different circuit topologies using a switching architecture. FIG. 2 depicts four electrical components 202, 204, 206, and 208, and three switches 210, 212, and 214. For this implementation, the switching architecture includes at least the three switches 210, 212, and 214. Switch 210 can be controlled to connect component 202 to either a first voltage level ($V_1$), a second voltage level ($V_2$), or component 206. Switch 212 can be controlled to connect component 204 to either $V_1$, analog ground, or a third voltage level ($V_3$). Components 202 and 204 are connected together at a shared node 216. Depending upon the state of switch 214, shared node 216 is connected or disconnected from component 208.

Depending upon the particular state of switches 210, 212, and 214, the electrical components 200 will form different circuit topologies and configurations. In a more complex implementation, the switching architecture can establish alternative conductive paths between components, connect/disconnect elements and components from each other, and/or alter the combined functionality of capacitors, resistors, operational amplifiers, and/or other electrical components. Accordingly, referring back to FIG. 1, switching architecture 108 may include any number of individual switching elements that cooperate with various electrical components and electrical conductors of capacitive sensing cell 102, module 104, and/or ADC 106 to rearrange and reconfigure circuit 100 into different topologies that support different modes of operation or functional phases. For example, as explained in more detail below, switching architecture 108 is preferably controlled such that circuit 100 can be operated in a reset phase, in at least one capacitance-to-voltage (C2V) phase, and at least one amplification phase. In addition, switching architecture 108 can be controlled to enable circuit 100 to operate in an analog-to-digital conversion phase.

Figure 3:
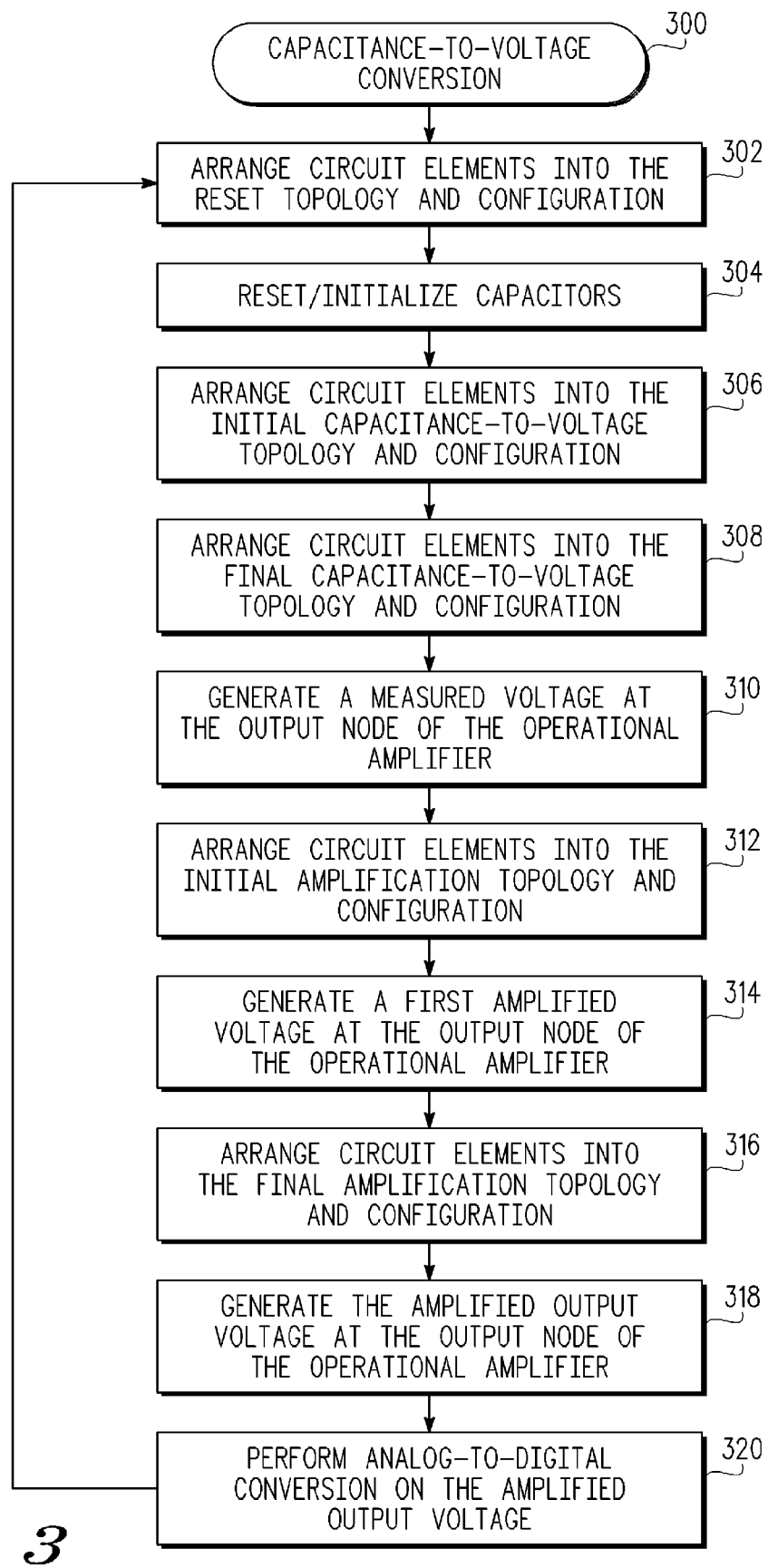
FIG. 3 is a flow chart that illustrates an embodiment of a capacitance-to-voltage conversion process.

FIG. 3 is a flow chart that illustrates an embodiment of a capacitance-to-voltage conversion process 300, which may be performed by a capacitance-to-voltage interface circuit such as circuit 100. The various tasks performed in connection with process 300 may be performed by software, hardware, firmware, or any combination thereof. It should be appreciated that process 300 may include any number of additional or alternative tasks, the tasks shown in FIG. 3 need not be performed in the illustrated order, and process 300 may be incorporated into a more comprehensive procedure or process having additional functionality not described in detail herein. In practice, portions of process 300 may be performed by different elements of the described system, e.g., a switching architecture, one or more switches, an amplifier circuit, an ADC circuit, or the like. In this regard, process 300 will be described with additional reference to FIGS. 4-8, which illustrate an embodiment of a capacitance-to-voltage interface circuit 400 arranged in different topologies and configurations. Circuit 400 may be implemented in or otherwise utilized with module 104 (see FIG. 1).

This embodiment of circuit 400 includes, without limitation, the following components and elements: a capacitive sensing cell 402 having a first sensing capacitor 404 (labeled $C_P$) coupled in series with a second sensing capacitor 406 (labeled $C_N$); an operational amplifier 408; an offset capacitor 410 (labeled $C_{DS}$) for operational amplifier 408; a first feedback capacitor 412 (labeled $C_{F1}$) for operational amplifier 408; a second feedback capacitor 414 (labeled $C_{F2}$) for operational amplifier 408; a first load capacitor 416 (labeled $C_{G1}$) for operational amplifier 408; and a second load capacitor 418 (labeled $C_{G2}$) for operational amplifier 408. Notably, a suitably controlled switching architecture (see FIG. 1) reconfigures circuit 400 for operation in a plurality of different phases and modes, such that operational amplifier 408 is used for capacitance-to-voltage conversion and for voltage amplification, as explained in more detail below. Although the actual circuit topology and configuration is altered during operation of circuit 400, the primary circuit elements and components listed above are utilized throughout the different operating phases.

The specific nominal values of the capacitors used in circuit 400 may be selected to suit the needs of the given application. The preferred embodiment described here assumes that the capacitors have values that are relative to a unit capacitance, where the unit capacitance is defined to be the capacitance of first feedback capacitor 412. The relative capacitance values for this example are as follows:

$C_P = C_O + dC$ $C_N = C_O - dC$ $C_{F1} = C_U$ $C_{F2} = 2 \times C_U$ $C_{G1} = 3 \times C_U$ $C_{G2} = N \times C_U$ In the above expressions, $C_P$ is the capacitance of first sensing capacitor 404, $C_N$ is the capacitance of second sensing capacitor 406, $C_{F1}$ is the capacitance of first feedback capacitor 412, $C_{F2}$ is the capacitance of second feedback capacitor 414, $C_{G1}$ is the capacitance of first load capacitor 416, $C_{G2}$ is the capacitance of second load capacitor 418, $C_U$ is the unit capacitance, $C_O$ is the capacitance of the sensing capacitor at zero acceleration, dC is the difference in capacitance caused by acceleration, motion, or positioning of capacitive sensing cell 402, and N is a multiplier that can be selected as needed for trimming the gain of circuit 400 using a variable capacitance for $C_{G2}$. In practice, the value of Cu will be dependent on the mismatch and parasitics of the capacitor, which vary with different technologies. In some embodiments, the value of Cu may be approximately equal to the value of Co. Of course, the actual value of Cu may be above or below this exemplary range. $C_O$ represents the capacitance of the sensing capacitor at zero acceleration, and $C_O$ is important for transducer design considerations for purposes of achieving higher sensitivity. The differential capacitance, dC, represents the change in capacitance of the sensing capacitor corresponding to 1.0 G of acceleration.

Referring again to FIG. 3, in certain embodiments, process 300 is iteratively performed in a continuous manner to monitor acceleration, motion, movement, vibration, shaking, and/or positioning of the host device. In this regard, process 300 can be repeated in an ongoing and real-time manner. For example, in some practical embodiments each iteration of process 300 is completed in less than about 50 microseconds. Thus, process 300 can be repeated very quickly in order to immediately detect changes in the capacitance of the capacitive sensing cell. The actual cycle time will depend on the associated clock frequency. As an example, for a clock frequency of 150 kHz, the total time to complete capacitance to voltage (four cycles) will be 26.67 microseconds. Thus, the total time can be changed by increasing or decreasing the clock frequency.

Figure 4:
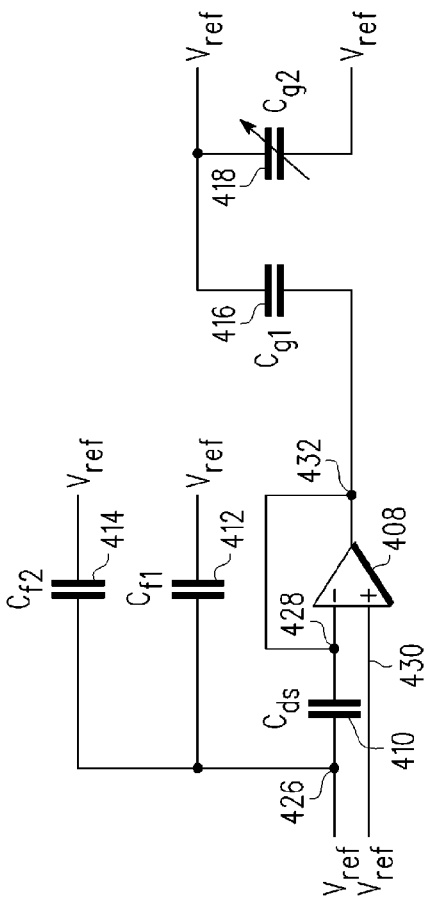
FIG. 4 is a circuit diagram that illustrates an embodiment of a capacitance-to-voltage interface circuit arranged in a reset topology and configuration.
Figure 4:
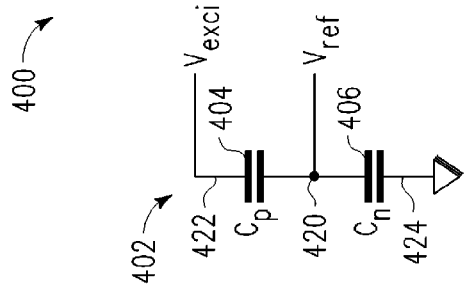

For this embodiment, process 300 begins by arranging the elements of circuit 400 into a predetermined reset topology and configuration (task 302). During the reset phase, circuit 400 is initialized and otherwise prepared for the next capacitance-to-voltage operation. FIG. 4 illustrates circuit 400 arranged in one exemplary topology suitable for operation during a reset phase. First sensing capacitor 404 is in series with second sensing capacitor 406, i.e., one of the conductors of first sensing capacitor 404 (the bottom conductor in FIG. 4) and one of the conductors of second sensing capacitor 406 (the top conductor in FIG. 4) are coupled to and share a common node 420. The output of capacitive sensing cell 402 is taken from this common node 420. Capacitive sensing cell 402 also includes a first sensor voltage node 422 associated with first sensing capacitor 404, and a second sensor voltage node 424 associated with second sensing capacitor 406. In FIG. 4, first sensor voltage node 422 corresponds to the top conductor of first sensing capacitor 404, and second sensor voltage node 424 corresponds to the bottom conductor of second sensing capacitor 406.

Operational amplifier 408 is adapted for selective coupling to capacitive sensing cell 402, using one or more switch elements (not shown). As depicted in FIG. 4, capacitive sensing cell 402 is reset by: disconnecting common node 420 from a feedback node 426 associated with operational amplifier 408, applying an excitation voltage (labeled $V_{EXCI}$) to first sensor voltage node 422, applying a reference voltage (labeled $V_{REF}$) to common node 420, and establishing analog ground at second sensor voltage node 424. In alternate embodiments, $V_{EXCI}$ is applied to second sensor voltage node 424, while first sensor voltage node 422 is pulled to analog ground. The disconnection of common node 420 from feedback node 426 effectively isolates capacitive sensing cell 402 from the other elements of circuit 400. In preferred embodiments, $V_{EXCI}$ is twice the voltage of $V_{REF}$, which results in equal charging of first sensing capacitor 404 and second sensing capacitor 406. Although $V_{EXCI}$ may be more or less than twice the voltage of $V_{REF}$, the double voltage is preferred to avoid electrostatic effects, oscillations, offset capacitor voltage, and capacitor noise. In certain embodiments, $V_{EXCI}$ is about 3.6 volts, and $V_{REF}$ is about 1.8 volts.

Operational amplifier 408 includes an inverting input node 428, a noninverting input node 430, and an output node 432. Noninverting input node 430 receives $V_{REF}$, as shown in FIGS. 4-8. Offset capacitor 410 is coupled between inverting input node 428 and feedback node 426, as shown in FIGS. 4-8. As is well known, offset capacitor 410 is used for double sampling purposes to reduce offset voltage associated with operational amplifier 408. During the reset phase, inverting input node 428 is connected to output node 432, thus causing operational amplifier 408 to function as a voltage follower.

During the reset phase depicted in FIG. 4, first feedback capacitor 412 and second feedback capacitor are both connected between feedback node 426 and $V_{REF}$. In other words, one conductor of first feedback capacitor 412 is coupled to feedback node 426, while $V_{REF}$ is applied to the other conductor. Likewise, one conductor of second feedback capacitor 414 is coupled to feedback node 426, while $V_{REF}$ is applied to the other conductor. Notably, $V_{REF}$ is also applied to feedback node 426. During the reset phase, first load capacitance 416 is connected between output node 432 and $V_{REF}$. In addition, $V_{REF}$ is connected across second load capacitor 418. In other words, $V_{REF}$ is applied to both conductors of second load capacitor 418.

The reset topology of FIG. 4 resets first feedback capacitor 412, second feedback capacitor 414, first load capacitor 416, and second load capacitor 418 to their respective initial voltages (zero volts in this example). In addition, the reset topology resets or otherwise initializes operational amplifier 408. At this time, the voltage at output node 432 will be $V_{REF}$ plus the offset voltage of operational amplifier 408; this resets first load capacitor 416. This topology also results in the charging of offset capacitor 410 to the offset voltage corresponding to operational amplifier 408. This occurs because the reset topology causes the voltage at the inverting input node 428 to be equal to $V_{REF}$ plus or minus the actual offset voltage of operational amplifier 408. Since $V_{REF}$ is applied at feedback node 426, offset capacitor 410 will be charged to the particular offset voltage of operational amplifier 408.

Figure 5:
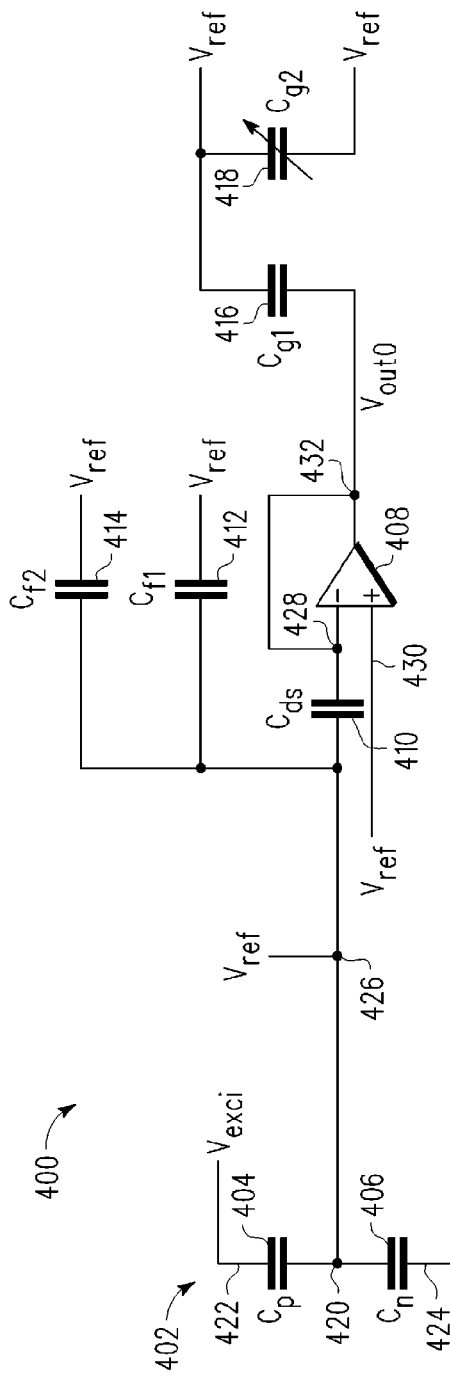
FIG. 5 is a circuit diagram that illustrates an embodiment of a capacitance-to-voltage interface circuit arranged in an initial capacitance-to-voltage topology and configuration.

Referring again to FIG. 3, circuit 400 preferably remains in the reset phase for a sufficient amount of time to allow the various capacitors to be reset/initialized (task 304). In other words, while the reset configuration is enabled, the capacitors are reset to their respective initial voltages. Thereafter, process 300 continues by arranging the elements of circuit 400 into an initial capacitance-to-voltage topology and configuration (task 306). In this regard, FIG. 5 is a circuit diagram that illustrates circuit 400 arranged for operation during an initial capacitance-to-voltage phase. During this initial capacitance-to-voltage phase, circuit 400 is prepared for the conversion of a measured difference in capacitance of capacitive sensing cell 402 into a measured voltage.

For the initial capacitance-to-voltage phase, circuit 400 is rearranged by connecting common node 420 of capacitive sensing cell 402 to feedback node 426. Thereafter, $V_{REF}$ is applied to common node 420 and to feedback node 426 (which now correspond to each other, as shown in FIG. 5). The other circuit element couplings and applied voltages are as described previously for the reset phase. Connecting capacitive sensing cell 402 to feedback node 426 in this manner is necessary to obtain a measurement from capacitive sensing cell 402.

During the initial capacitance-to-voltage phase, the voltage at output node 432 will be $V_{OUT0}=V_{OFF}+V_{REF}$, where $V_{OFF}$ (which may be positive or negative) is the offset voltage of operational amplifier 408. In accordance with well known electronic circuit theory, the charge associated with the various capacitors during this phase will be:

$$Q_P=(C_O+dC)\times(V_{REF}-V_{EXCI})$$

$$Q_N=(C_O-dC)\times V_{REF}$$

$$Q_{F1}=0$$

$$Q_{F2}=2\times C_U\times(V_{REF}-V_{REF})=0$$

$$Q_{G1}=3\times C_U\times(V_{REF}-V_{OUT0})$$

$$Q_{G2}=0$$

Referring again to FIG. 3, circuit 400 preferably remains in the initial capacitance-to-voltage phase for a sufficient amount of time before transitioning to the next phase. In this regard, process 300 continues by arranging the elements of circuit 400 into a final capacitance-to-voltage topology and configuration (task 308). FIG. 6 is a circuit diagram that illustrates circuit 400 arranged for operation during the final capacitance-to-voltage phase. During this final capacitance-to-voltage phase, circuit 400 obtains a measured voltage that is indicative of the measured difference or change in capacitance experienced by capacitive sensing cell 402.

For the final capacitance-to-voltage phase, circuit 400 is rearranged in a number of different ways. For instance, the polarity of capacitive sensing cell 402 is reversed by establishing analog ground at first sensor voltage node 422 (in lieu of $V_{EXCI}$) and by applying $V_{EXCI}$ to second sensor voltage node (in lieu of analog ground). Moreover, $V_{REF}$ is removed from common node 420 and from feedback node 426. This topology allows circuit 400 to obtain the capacitance measure from capacitive sensing cell 402. In addition, this topology enables operational amplifier 408 to function as an integrator with first feedback capacitor 412 and with first load capacitor 416 acting as the load. This topology produces the measured voltage at output node 432.

As shown in FIG. 6, operational amplifier 408 is no longer arranged in a voltage follower configuration. Rather, for the final capacitance-to-voltage phase, inverting input node 428 is disconnected from output node 432. Moreover, $V_{REF}$ is removed from the conductor of first feedback capacitor 412, and that conductor is connected to output node 432. Thus, first feedback capacitor 412 is coupled between feedback node 426 and output node 432 during the final capacitance-to-voltage phase. The configuration and arrangement of first load capacitor 416 and second load capacitor 418 following output node 432 remains as described above for the previous phase.

During the final capacitance-to-voltage phase, the voltage at output node 432 will be $$V_{OUT1}=2\times dC\times\frac{V_{EXCI}}{C_{F1}}+V_{REF}.$$

In accordance with well known electronic circuit theory, the charge associated with the various capacitors during this phase will be:

$$Q'_P = (C_O + dc) \times V_{REF}$$

$$Q'_N = (C_O - dc) \times (V_{REF} - V_{EXCI})$$

$$Q'_{F1} = C_U \times (V_{REF} - V_{OUT1})$$

$$Q'_{F2} = 2 \times C_U \times (V_{REF} - V_{REF}) = 0$$

$$Q'_{G1} = 3 \times C_U \times (V_{REF} - V_{OUT1})$$

$$Q'_{G2} = 0$$

Moreover, $Q_P + Q_N + Q_{F1} = Q'_P + Q'_N + Q'_{F1}$.

Referring again to FIG. 3, circuit 400 preferably remains in the final capacitance-to-voltage phase for a sufficient amount of time that allows operational amplifier 408 to generate the measured voltage at output node 432 (task 310), where the measured voltage indicates the measured difference in capacitance of capacitive sensing cell 402. Thereafter, process 300 continues by arranging the elements of circuit 400 into an initial amplification topology and configuration (task 312). In this regard, FIG. 7 is a circuit diagram that illustrates circuit 400 arranged for operation in the initial amplification phase.

For the initial amplification phase, circuit 400 is reconfigured by disconnecting common node 420 from feedback node 426, thus isolating capacitive sensing cell 402 from the remaining elements of circuit 400. At this time, the voltages at first sensor voltage node 422, second sensor voltage node 424, and common node 420 can be arbitrarily set to any respective voltage. For example, it may be desirable to prepare capacitive sensing cell 402 for the next reset phase (see FIG. 4). In addition to disconnecting common node 420 from feedback node 426, the initial amplification topology is achieved by removing first load capacitor from between output node 432 and $V_{REF}$ and instead connecting it between feedback node 426 and $V_{REF}$, as depicted in FIG. 7. In other words, the conductor of first load capacitor 416 that was previously connected to output node 432 is now connected to $V_{REF}$, while the other conductor of first load capacitor is now connected to feedback node 426 (rather than $V_{REF}$). Furthermore, $V_{REF}$ is removed such that it is no longer across second load capacitor 418. Instead, second load capacitor 418 is connected between output node 432 and $V_{REF}$. In this regard, the top conductor (relative to the illustrated perspective) of second load capacitor 418 remains connected to $V_{REF}$, however, the bottom conductor of second load capacitor 418 is now connected to output node 432 (in lieu of $V_{REF}$).

During the initial amplification phase, second load capacitor 418 represents the load, and the voltage at output node 432 will be $V_{OUT2} = 4 \times (V_{OUT1} - V_{REF}) + V_{REF}$. In accordance with well known electronic circuit theory, the charge associated with the various capacitors during this phase will be:

$$Q''_{F1} = C_U \times (V_{REF} - V_{OUT2})$$

$$Q''_{F2} = 2 \times C_U \times (V_{REF} - V_{REF}) = 0$$

$$Q''_{G1} = 0$$

$$Q''_{G2} = N \times C_U \times (V_{REF} - V_{OUT2})$$

Moreover, $Q'_{F1} + Q'_{G2} = Q''_{F1} + Q''_{G2}$.

Figure 8:
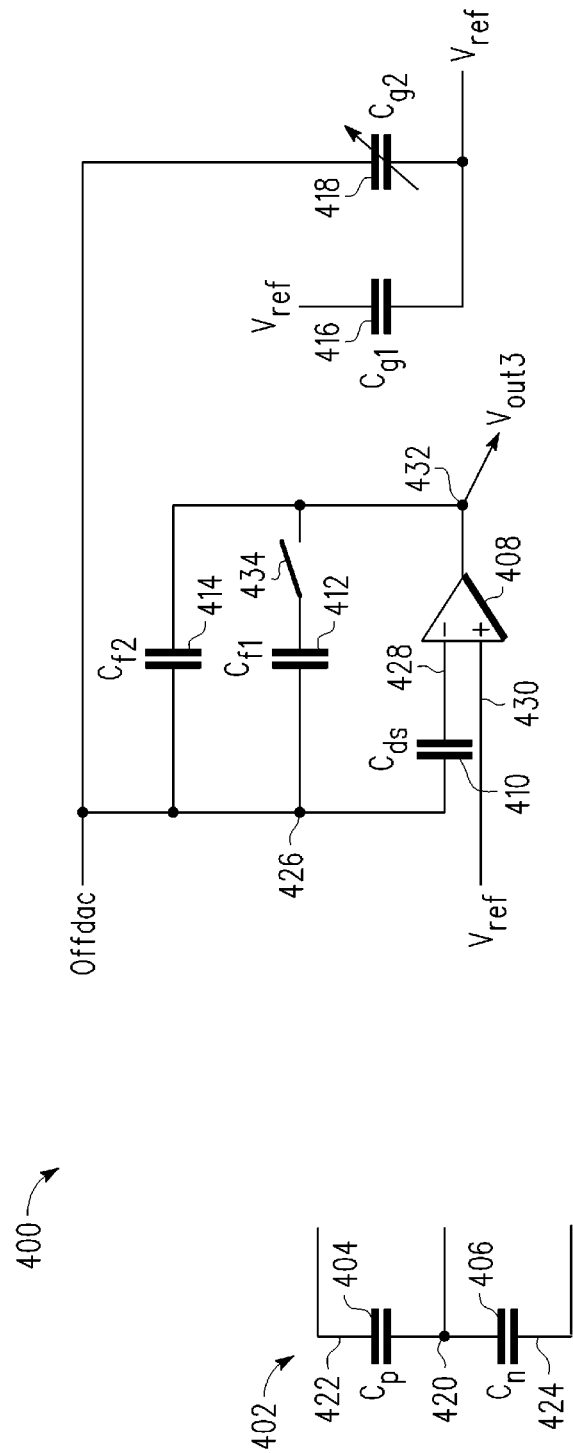
FIG. 8 is a circuit diagram that illustrates an embodiment of a capacitance-to-voltage interface circuit arranged in a final amplification topology and configuration.

Referring again to FIG. 3, circuit 400 preferably remains in the initial amplification phase for a sufficient amount of time that allows operational amplifier 408 to amplify the previously measured voltage and generate a first amplified voltage at output node 432 (task 314). This first amplified voltage (i.e., $V_{OUT2}$) will be based upon the measured voltage (i.e., $V_{OUT1}$) and $V_{REF}$. Thereafter, process 300 continues by rearranging the elements of circuit 400 into a final amplification topology and configuration (task 316). In this regard, FIG. 8 is a circuit diagram that illustrates circuit 400 arranged for operation in the final amplification phase.

For the final amplification phase, capacitive sensing cell 402 remains isolated from the remainder of circuit 400, as described for the initial amplification phase. Again, the voltages at first sensor voltage node 422, second sensor voltage node 424, and common node 420 can be arbitrarily set as desired. For this phase, circuit 400 is reconfigured and rearranged in a number of ways. For instance, first feedback capacitor 412 is removed from between feedback node 426 and output node 432. FIG. 8 depicts how a switch 434 might be opened to disconnect first feedback capacitor 412 from the feedback path. For this phase, second feedback capacitor 414 is connected between feedback node 426 and output node 432. In other words, $V_{REF}$ is removed from the right conductor (as viewed in the figures) of second feedback capacitor 414 and, instead, the right conductor is connected to output node 432. In addition, an offset voltage (labeled Offdac) is applied to feedback node 426, which also corresponds to the node shared by first feedback capacitor 412 and second feedback capacitor 414. The Offdac voltage may be provided by a suitably configured correction circuit (not shown). The Offdac voltage is used to compensate for offset drift that may occur due to sensing capacitor mismatch, parasitic effects, leakage, charge injection, or any unknown effects by either injecting or extracting charge from the output.

The two load capacitors are also reconfigured for the final amplification phase. In particular, circuit 400 is rearranged such that $V_{REF}$ is connected across first load capacitor 416. To accomplish this, first load capacitor 416 is removed from between feedback node 426 and $V_{REF}$ and, instead, $V_{REF}$ is applied to both of its conductors. In other words, the top conductor of first load capacitor 416 is removed from feedback node 426 and then connected to $V_{REF}$. Second load capacitor 418 is removed from between output node 432 and $V_{REF}$, and is instead connected between the offset voltage and $V_{REF}$. More specifically, $V_{REF}$ is removed from the top conductor of second load capacitor 418, which is then connected to feedback node 426, and the bottom conductor of second load capacitor 418 is removed from output node 432 and connected to $V_{REF}$.

During the final amplification phase, operational amplifier 408 is gained by the ratio of second feedback capacitor 414 and second load capacitor 418. Notably, the variable nature of second load capacitor 418 can be used to compensate for mismatching of first sensing capacitor 404 and second sensing capacitor 406. In other words, the capacitance of second load capacitor 418 can be adjusted or set to provide gain trim as needed. The resulting voltage at output node 432 will be $$V_{OUT3} = (V_{OUT2} - V_{REF}) \times \frac{N}{2} + V_{REF}.$$

In accordance with well known electronic circuit theory, the charge associated with the various capacitors during this phase will be:

$$Q'''_{F1} = C_U \times (V_{REF} - V_{OUT2})$$

$$Q'''_{F2} = 2 \times C_U \times (V_{REF} - V_{OUT3})$$

$$Q'''_{G1} = 0$$

$$Q'''_{G2} = 0$$

Moreover, $Q''_{F2} + Q''_{G2} = Q'''_{F2} + Q'''_{G2}$.

Referring again to FIG. 3, circuit 400 preferably remains in the final amplification phase for a sufficient amount of time that allows operational amplifier 408 to generate a second amplified voltage at output node 432 (task 318). This second amplified voltage (i.e., $V_{OUT3}$) will be based upon the first amplified voltage (i.e., $V_{OUT2}$) and $V_{REF}$. Thereafter, this embodiment of process 300 continues by performing an appropriate analog-to-digital conversion on $V_{OUT3}$ (task 320). The digital representation of $V_{OUT3}$ can then be processed by the host device in an appropriate manner.

The path from task 320 back to task 302 indicates the iterative nature of process 300. As mentioned previously, process 300 can be repeated very frequently such that it can detect and measure changes in capacitance that occur in real time. Such changes can result from movement, acceleration, shaking, or other manipulation of the host device.

Figure 9:
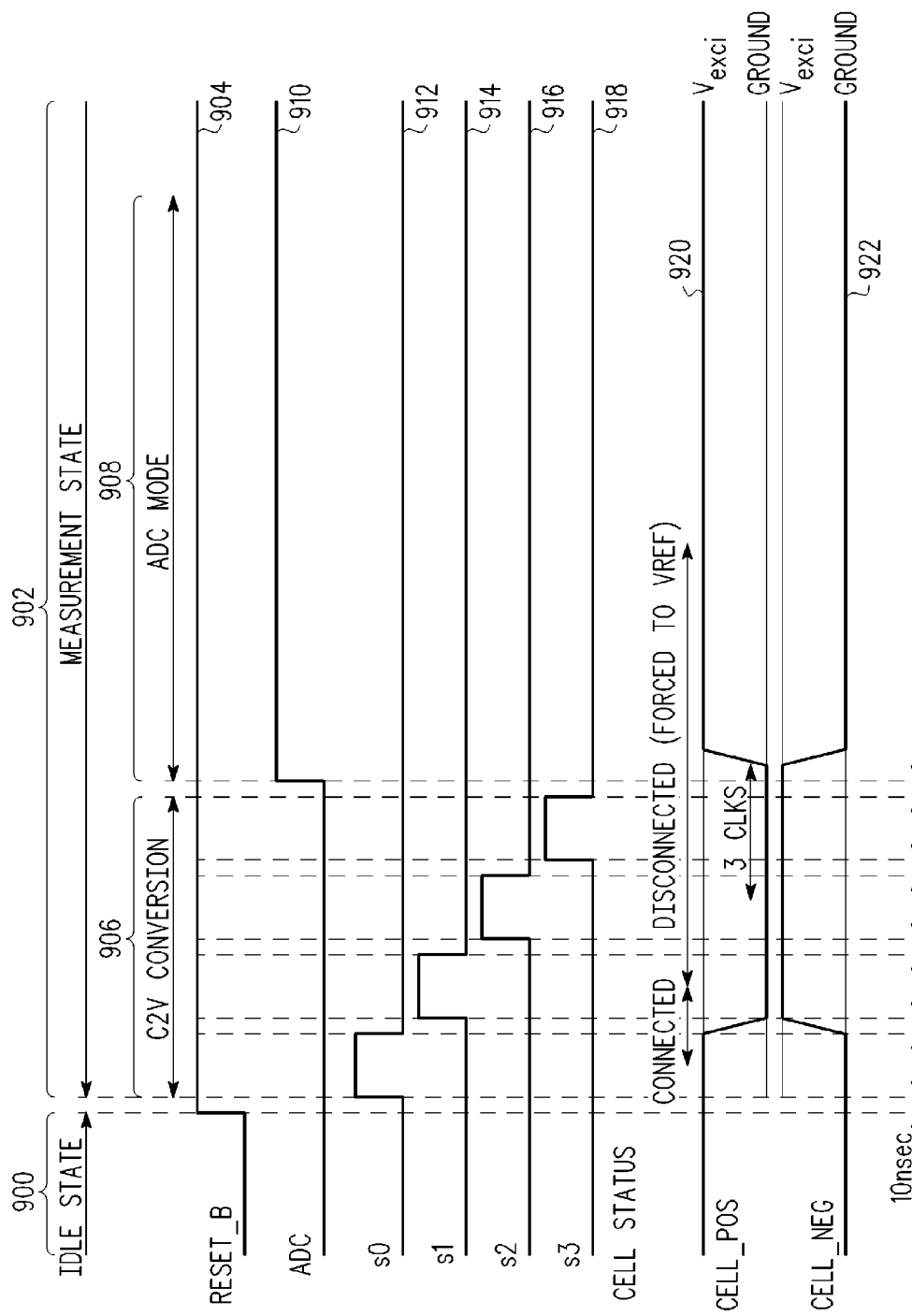
FIG. 9 is a timing diagram that illustrates exemplary operational states and voltages associated with the operation of an embodiment of a capacitance-to-voltage interface circuit, such as that shown in FIGS. 4-8.

FIG. 9 is a timing diagram that illustrates exemplary operational states, clock signals, and voltages associated with the operation of an embodiment of a capacitance-to-voltage interface circuit, such as that shown in FIGS. 4-8. The horizontal axis represents increasing time, and a number of different clock signals and voltages are depicted along the vertical axis. This timeline is generally divided into two states: an idle state 900 and a measurement state 902. A reset control signal (labeled RESET_B) 904 can be utilized to transition between idle state 900 and measurement state 902. This particular embodiment employs an active low reset control signal 904; the capacitance-to-voltage interface circuit is maintained in the reset phase (discussed above) while reset control signal 904 is low, and the interface circuit performs the measurement phases and other operations while reset control signal 904 is high.

Measurement state 902 is generally divided into two stages: a capacitance-to-voltage (C2V) conversion stage 906 and an ADC mode stage 908. These stages are associated with an ADC control signal 910, which controls activation of the ADC conversion of the amplified output voltage. This embodiment employs an active high ADC control signal 910; the ADC mode is disabled during C2V conversion because ADC control signal 910 is low, and the ADC mode is enabled when ADC control signal 910 goes high. The C2V conversion stage 906 corresponds to the four measurement phases described above, namely, the initial C2V phase, the final C2V phase, the initial amplification phase, and the final amplification phase. FIG. 9 depicts four clock or control signals that correspond to the activation of these four phases. In particular, an S0 signal 912 is utilized to activate the initial C2V phase, an S1 signal 914 is utilized to activate the final C2V phase, an S2 signal 916 is utilized to activate the initial amplification phase, and an S3 signal 918 is used to activate the final amplification phase. Each of these clock/control signals is an active high signal in that the respective phase is enabled when its corresponding clock/control signal is high, and is disabled when its corresponding clock/control signal is low. As depicted in FIG. 9, each of the four measurement phases may be separated by a very short time period (e.g., 10 nanoseconds), and each of the four measurement phases may be enabled for about the same amount of time.

The lower portion of FIG. 9 shows the voltages that are respectively applied to the two sensing capacitors of the capacitive sensing cell. The voltage signal 920 represents the voltage applied to the first (e.g., the positive) sensing capacitor 404, and the voltage signal 922 represents the voltage applied to the second (e.g., the negative) sensing capacitor 406. Referring to FIGS. 4-8, voltage signal 920 is applied to the top conductor of first sensing capacitor 404, and voltage signal 922 is applied to the bottom conductor of second sensing capacitor 406. FIG. 9 illustrates that $V_{EXCI}$ is initially applied to first sensing capacitor 404, and that analog ground is initially applied to second sensing capacitor 406. However, at or near the transition between the initial C2V phase and the final C2V phase, the voltages are reversed. In other words, for the final C2V phase analog ground is applied to first sensing capacitor 404, and $V_{EXCI}$ is applied to second sensing capacitor 406.

FIG. 9 depicts an embodiment where the voltages applied to first sensing capacitor 404 and second sensing capacitor 406 during the final C2V phase are thereafter maintained for the duration of C2V conversion stage 906 and for the duration of ADC mode stage 908. In practice, however, the voltages applied to first sensing capacitor 404 and second sensing capacitor 406 after the final C2V phase are somewhat arbitrary because the capacitive sensing cell is disconnected from the remainder of the interface circuit during that time (see FIGS. 7 and 8). It should be appreciated that the timeline depicted in FIG. 9 repeats itself for each iteration of the process. In other words, the next idle state 900 will follow the current measurement state 902.

In summary, systems, devices, and methods configured in accordance with exemplary embodiments relate to:

A capacitance-to-voltage interface circuit comprising a capacitive sensing cell, an operational amplifier adapted for selective coupling to the capacitive sensing cell, a feedback capacitor for the operational amplifier, a load capacitor for the operational amplifier, and a switching architecture associated with the capacitive sensing cell, the operational amplifier, the feedback capacitor, and the load capacitor. The switching architecture reconfigures the capacitance-to-voltage interface circuit for operation in a plurality of different phases such that the operational amplifier is used for capacitance-to-voltage conversion and for voltage amplification. The plurality of different phases may comprise a reset phase during which the feedback capacitor and the load capacitor are reset to their respective initial voltages. The plurality of different phases may comprise at least one capacitance-to-voltage phase during which a measured difference in capacitance of the capacitive sensing cell is converted into a measured voltage. The plurality of different phases may comprise at least one amplification phase during which the measured voltage is amplified into an output voltage. The circuit may further comprise an analog-to-digital converter coupled to the operational amplifier, the analog-to-digital converter being configured to convert the output voltage into an equivalent digital representation.

A method of performing capacitance-to-voltage conversion in a capacitance-to-voltage interface circuit comprising a capacitive sensing cell having a first sensing capacitor coupled in series with a second sensing capacitor, an operational amplifier having an inverting input node and a noninverting input node that receives a reference voltage, an offset capacitor coupled between the inverting input node and a feedback node, a first feedback capacitor coupled to the feedback node, a second feedback capacitor coupled to the feedback node, a first load capacitor for the operational amplifier, and a second load capacitor for the operational amplifier, a method of performing. The method involves: arranging the capacitive sensing cell, the operational amplifier, the offset capacitor, the first feedback capacitor, the second feedback capacitor, the first load capacitor, and the second load capacitor into a first topology; thereafter, obtaining a measured voltage that is indicative of a measured difference in capacitance of the capacitive sensing cell; rearranging the capacitive sensing cell, the operational amplifier, the offset capacitor, the first feedback capacitor, the second feedback capacitor, the first load capacitor, and the second load capacitor into a second topology; and thereafter, amplifying the measured voltage into an output voltage. The method may further comprise performing an analog-to-digital conversion on the output voltage. The method may further comprise: arranging the capacitive sensing cell, the operational amplifier, the offset capacitor, the first feedback capacitor, the second feedback capacitor, the first load capacitor, and the second load capacitor into a reset configuration; and while the reset configuration is enabled, resetting the first feedback capacitor, the second feedback capacitor, the first load capacitor, and the second load capacitor to their respective initial voltages. In certain embodiments, the capacitive sensing cell comprises a first sensor voltage node associated with the first sensing capacitor, a second sensor voltage node associated with the second sensing capacitor, and a common node shared by the first sensing capacitor and the second sensing capacitor, and the operational amplifier has an output node. In such embodiments, arranging the capacitive sensing cell, the operational amplifier, the offset capacitor, the first feedback capacitor, the second feedback capacitor, the first load capacitor, and the second load capacitor into the reset configuration comprises: disconnecting the common node of the capacitive sensing cell from the feedback node; applying an excitation voltage to the first sensor voltage node; applying the reference voltage to the common node; establishing analog ground at the second sensor voltage node; connecting the first feedback capacitor between the feedback node and the reference voltage; connecting the second feedback capacitor between the feedback node and the reference voltage; connecting the inverting input node to the output node; connecting the first load capacitor between the output node and the reference voltage; and connecting the reference voltage across the second load capacitor. In some embodiments, the capacitive sensing cell comprises a first sensor voltage node associated with the first sensing capacitor, a second sensor voltage node associated with the second sensing capacitor, and a common node shared by the first sensing capacitor and the second sensing capacitor, and the operational amplifier has an output node. In such embodiments, the method further comprises arranging the capacitive sensing cell, the operational amplifier, the offset capacitor, the first feedback capacitor, the second feedback capacitor, the first load capacitor, and the second load capacitor into an initial capacitance-to-voltage configuration by: connecting the common node of the capacitive sensing cell to the feedback node; applying an excitation voltage to the first sensor voltage node; applying the reference voltage to the common node and to the feedback node; establishing analog ground at the second sensor voltage node; connecting the first feedback capacitor between the feedback node and the reference voltage; connecting the second feedback capacitor between the feedback node and the reference voltage; connecting the inverting input node to the output node; connecting the first load capacitor between the output node and the reference voltage; and connecting the reference voltage across the second load capacitor. In certain embodiments, the capacitive sensing cell comprises a first sensor voltage node associated with the first sensing capacitor, a second sensor voltage node associated with the second sensing capacitor, and a common node shared by the first sensing capacitor and the second sensing capacitor, and the operational amplifier has an output node. In such embodiments, the method further comprises arranging the capacitive sensing cell, the operational amplifier, the offset capacitor, the first feedback capacitor, the second feedback capacitor, the first load capacitor, and the second load capacitor into a final capacitance-to-voltage configuration by: connecting the common node of the capacitive sensing cell to the feedback node; establishing analog ground at the first sensor voltage node; applying the reference voltage to the second sensor voltage node; connecting the first feedback capacitor between the feedback node and the output node; connecting the second feedback capacitor between the feedback node and the reference voltage; connecting the first load capacitor between the output node and the reference voltage; and connecting the reference voltage across the second load capacitor. In some embodiments, the capacitive sensing cell comprises a common node shared by the first sensing capacitor and the second sensing capacitor, and the operational amplifier has an output node. In such embodiments, the method further comprises arranging the capacitive sensing cell, the operational amplifier, the offset capacitor, the first feedback capacitor, the second feedback capacitor, the first load capacitor, and the second load capacitor into an initial amplification configuration by: disconnecting the common node of the capacitive sensing cell from the feedback node; connecting the first feedback capacitor between the feedback node and the output node; connecting the second feedback capacitor between the feedback node and the reference voltage; connecting the first load capacitor between the feedback node and the reference voltage; and connecting the second load capacitor between the output node and the reference voltage. In some embodiments, the capacitive sensing cell comprises a common node shared by the first sensing capacitor and the second sensing capacitor, and the operational amplifier has an output node. In such embodiments, the method further comprises arranging the capacitive sensing cell, the operational amplifier, the offset capacitor, the first feedback capacitor, the second feedback capacitor, the first load capacitor, and the second load capacitor into a final amplification configuration by: disconnecting the common node of the capacitive sensing cell from the feedback node; applying an offset voltage to the feedback node; connecting the second feedback capacitor between the feedback node and the output node; connecting the reference voltage across the first load capacitor; and connecting the second load capacitor between the feedback node and the reference voltage.

A capacitance-to-voltage conversion method comprising: providing a capacitive sensing cell having a first sensing capacitor coupled in series with a second sensing capacitor, a first sensor voltage node associated with the first sensing capacitor, a second sensor voltage node associated with the second sensing capacitor, and a common node shared by the first sensing capacitor and the second sensing capacitor; providing an operational amplifier having an inverting input node, a noninverting input node that receives a reference voltage, and an output node; providing an offset capacitor between the inverting input node and a feedback node; providing a first feedback capacitor having one of its conductors coupled to the feedback node; providing a second feedback capacitor having one of its conductors coupled to the feedback node; disconnecting the common node from the feedback node; applying an excitation voltage to the first sensor voltage node; applying the reference voltage to the common node; establishing analog ground at the second sensor voltage node; applying the reference voltage to the other conductor of the first feedback capacitor; applying the reference voltage to the other conductor of the second feedback capacitor; connecting the inverting input node to the output node; connecting a first load capacitor between the output node and the reference voltage; and connecting the reference voltage across a second load capacitor.

The method may further comprise resetting the first feedback capacitor, the second feedback capacitor, the first load capacitor, and the second load capacitor to their respective initial voltages. The method may further comprise: connecting the common node to the feedback node; and applying the reference voltage to the common node and to the feedback node. The method may further comprise: establishing analog ground at the first sensor voltage node, in lieu of the excitation voltage; removing the reference voltage from the common node and from the feedback node; applying the excitation voltage to the second sensor voltage node, in lieu of analog ground; disconnecting the inverting input node from the output node; removing the reference voltage from the other conductor of the first feedback capacitor; and connecting the other conductor of the first feedback capacitor to the output node. The method may further comprise generating a measured voltage at the output node, the measured voltage indicating a measured difference in capacitance of the capacitive sensing cell. The method may further comprise: disconnecting the common node from the feedback node; removing the first load capacitor from between the output node and the reference voltage; connecting the first load capacitor between the feedback node and the reference voltage; removing the reference voltage across the second load capacitor; and connecting the second load capacitor between the output node and the reference voltage. The method may further comprise generating a first amplified voltage at the output node, the first amplified voltage being based upon the measured voltage and the reference voltage. The method may further comprise: removing the first feedback capacitor from between the feedback node and the output node; removing the reference voltage from the other conductor of the second feedback capacitor; connecting the other conductor of the second feedback capacitor to the output node; connecting the feedback node to an offset voltage; removing the first load capacitor from between the feedback node and the reference voltage; connecting the reference voltage across the first load capacitor; removing the second load capacitor from between the output node and the reference voltage; and connecting the second load capacitor between the offset voltage and the reference voltage. The method may further comprise generating a second amplified voltage at the output node, the second amplified voltage being based upon the first amplified voltage and the reference voltage. The method may further comprise performing an analog-to-digital conversion on the second amplified voltage.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A capacitance-to-voltage interface circuit comprising:
   a capacitive sensing cell having a first sensing capacitor coupled in series with a second sensing capacitor;
   an operational amplifier adapted for selective coupling to the capacitive sensing cell and having an inverting input node and a noninverting input node that receives a reference voltage;
   an offset capacitor coupled between the inverting input node and a feedback node;
   a first feedback capacitor coupled to the feedback node;
   a second feedback capacitor coupled to the feedback node;
   a first load capacitor for the operational amplifier; and
   a second load capacitor for the operational amplifier;
   wherein the capacitance-to-voltage interface circuit is configurable into a plurality of configurations in which:
      when the capacitive sensing cell, the operational amplifier, the offset capacitor, the first feedback capacitor, the second feedback capacitor, the first load capacitor, and the second load capacitor are arranged into a reset configuration to reset the first feedback capacitor, the second feedback capacitor, the first load capacitor, and the second load capacitor to respective initial voltages, the capacitive sensing cell is disconnected from the operational amplifier;
      when the capacitive sensing cell, the operational amplifier, the offset capacitor, the first feedback capacitor, the second feedback capacitor, the first load capacitor, and the second load capacitor are thereafter switched from the reset configuration into an initial capacitance-to-voltage configuration, the capacitive sensing cell is connected to the operational amplifier;
      when the capacitive sensing cell, the operational amplifier, the offset capacitor, the first feedback capacitor, the second feedback capacitor, the first load capacitor, and the second load capacitor are thereafter switched from the initial capacitance-to-voltage configuration into a final capacitance-to-voltage configuration, a measured output voltage of the operational amplifier that is indicative of a measured difference in capacitance of the capacitive sensing cell is obtained; and
      when the capacitive sensing cell, the operational amplifier, the offset capacitor, the first feedback capacitor, the second feedback capacitor, the first load capacitor, and the second load capacitor are thereafter switched from the final capacitance-to-voltage configuration into an amplification topology, the measured output voltage of the operational amplifier is amplified into an output voltage.

2. The circuit of claim 1, further comprising:
   an analog-to-digital converter configured to perform an analog-to-digital conversion on the output voltage.

3. The circuit of claim 1, wherein:
   the capacitive sensing cell comprises a first sensor voltage node associated with the first sensing capacitor, a second sensor voltage node associated with the second sensing capacitor, and a common node shared by the first sensing capacitor and the second sensing capacitor;
   the operational amplifier has an output node; and
   when arranged in the reset configuration:
      the common node of the capacitive sensing cell is disconnected from the feedback node;
      an excitation voltage is applied to the first sensor voltage node;

the reference voltage is applied to the common node;
analog ground is established at the second sensor voltage node;
the first feedback capacitor is connected between the feedback node and the reference voltage;
the second feedback capacitor is connected between the feedback node and the reference voltage;
the inverting input node is connected to the output node;
the first load capacitor is connected between the output node and the reference voltage; and
the reference voltage is connected across the second load capacitor.

4. The circuit of claim 1, wherein:
the capacitive sensing cell comprises a first sensor voltage node associated with the first sensing capacitor, a second sensor voltage node associated with the second sensing capacitor, and a common node shared by the first sensing capacitor and the second sensing capacitor;
the operational amplifier has an output node; and
when arranged in the initial capacitance-to-voltage configuration:
the common node of the capacitive sensing cell is connected to the feedback node;
an excitation voltage is applied to the first sensor voltage node;
the reference voltage is applied to the common node and to the feedback node;
analog ground is established at the second sensor voltage node;
the first feedback capacitor is connected between the feedback node and the reference voltage;
the second feedback capacitor is connected between the feedback node and the reference voltage;
the inverting input node is connected to the output node;
the first load capacitor is connected between the output node and the reference voltage; and
the reference voltage is connected across the second load capacitor.

5. The circuit of claim 1, wherein:
the capacitive sensing cell comprises a first sensor voltage node associated with the first sensing capacitor, a second sensor voltage node associated with the second sensing capacitor, and a common node shared by the first sensing capacitor and the second sensing capacitor;
the operational amplifier has an output node; and
when arranged in the final capacitance-to-voltage configuration:
the common node of the capacitive sensing cell is connected to the feedback node;
analog ground is established at the first sensor voltage node;
the reference voltage is applied to the second sensor voltage node;
the first feedback capacitor is connected between the feedback node and the output node;
the second feedback capacitor is connected between the feedback node and the reference voltage;
the first load capacitor is connected between the output node and the reference voltage; and
the reference voltage is connected across the second load capacitor.

6. The circuit of claim 1, wherein:
the capacitive sensing cell comprises a common node shared by the first sensing capacitor and the second sensing capacitor;
the operational amplifier has an output node; and
the capacitive sensing cell, the operational amplifier, the offset capacitor, the first feedback capacitor, the second feedback capacitor, the first load capacitor, and the second load capacitor are configurable in an initial amplification configuration in which:
the common node of the capacitive sensing cell is disconnected from the feedback node;
the first feedback capacitor is connected between the feedback node and the output node;
the second feedback capacitor is connected between the feedback node and the reference voltage;
the first load capacitor is connected between the feedback node and the reference voltage; and
the second load capacitor is connected between the output node and the reference voltage.

7. The circuit of claim 1, wherein:
the capacitive sensing cell comprises a common node shared by the first sensing capacitor and the second sensing capacitor;
the operational amplifier has an output node; and
the capacitive sensing cell, the operational amplifier, the offset capacitor, the first feedback capacitor, the second feedback capacitor, the first load capacitor, and the second load capacitor are configurable in a final amplification configuration in which:
the common node of the capacitive sensing cell is disconnected from the feedback node;
an offset voltage is applied to the feedback node;
the second feedback capacitor is connected between the feedback node and the output node;
the reference voltage is connected across the first load capacitor; and
the second load capacitor is connected between the feedback node and the reference voltage.

8. The circuit of claim 1, further comprising a switching architecture associated with the capacitive sensing cell, the operational amplifier, the offset capacitor, the first feedback capacitor, the second feedback capacitor, the first load capacitor, and the second load capacitor.

9. The circuit of claim 8, wherein the switching architecture reconfigures the circuit for operation in the reset configuration, the initial capacitance-to-voltage configuration, the final capacitance-to-voltage configuration, and the amplification topology such that the operational amplifier is used for capacitance-to-voltage conversion and for voltage amplification.

10. A capacitance-to-voltage interface circuit comprising:
a capacitive sensing cell having a first sensing capacitor coupled in series with a second sensing capacitor;
an operational amplifier having an inverting input node and a noninverting input node that receives a reference voltage;
an offset capacitor coupled between the inverting input node and a feedback node;
a first feedback capacitor coupled to the feedback node;
a second feedback capacitor coupled to the feedback node;
a first load capacitor;
a second load capacitor; and
a switching architecture associated with the capacitive sensing cell, the operational amplifier, the offset capacitor, the first feedback capacitor, the second feedback capacitor, the first load capacitor, and the second load capacitor, wherein the switching architecture operates to arrange the capacitance-to-voltage interface circuit into a plurality of configurations, including:
a reset configuration to reset the first feedback capacitor, the second feedback capacitor, the first load capacitor, and the second load capacitor to respective initial voltages, wherein the capacitive sensing cell is disconnected from the operational amplifier when the capacitance-to-voltage interface circuit is arranged in the reset configuration;

an initial capacitance-to-voltage configuration, wherein the capacitive sensing cell is connected to the operational amplifier when the capacitance-to-voltage interface circuit is arranged in the initial capacitance-to-voltage configuration;

a final capacitance-to-voltage configuration, wherein a measured output voltage of the operational amplifier that is indicative of a measured difference in capacitance of the capacitive sensing cell is obtained when the capacitance-to-voltage interface circuit is arranged in the final capacitance-to-voltage configuration; and an amplification topology, wherein the measured output voltage of the operational amplifier is amplified into an output voltage when the capacitance-to-voltage interface circuit is arranged in the amplification topology.

11. The circuit of claim 10, wherein the switching architecture operates to initialize the capacitance-to-voltage interface circuit by arranging the capacitance-to-voltage interface circuit into the reset configuration.

12. The circuit of claim 11, wherein the switching architecture operates to transition the capacitance-to-voltage interface circuit from the reset configuration to the initial capacitance-to-voltage configuration.

13. The circuit of claim 12, wherein the switching architecture operates to transition the capacitance-to-voltage interface circuit from the initial capacitance-to-voltage configuration to the final capacitance-to-voltage configuration.

14. The circuit of claim 13, wherein the switching architecture operates to transition the capacitance-to-voltage interface circuit from the final capacitance-to-voltage configuration to an initial amplification topology.

15. The circuit of claim 14, wherein the switching architecture operates to transition the capacitance-to-voltage interface circuit from the initial amplification topology to a final amplification topology.

16. The circuit of claim 10, wherein:
the capacitive sensing cell comprises a first sensor voltage node associated with the first sensing capacitor, a second sensor voltage node associated with the second sensing capacitor, and a common node shared by the first sensing capacitor and the second sensing capacitor;
the operational amplifier has an output node; and
when arranged in the reset configuration:
    the common node of the capacitive sensing cell is disconnected from the feedback node;
    an excitation voltage is applied to the first sensor voltage node;
    the reference voltage is applied to the common node;
    analog ground is established at the second sensor voltage node;
    the first feedback capacitor is connected between the feedback node and the reference voltage;
    the second feedback capacitor is connected between the feedback node and the reference voltage;
    the inverting input node is connected to the output node;
    the first load capacitor is connected between the output node and the reference voltage; and
    the reference voltage is connected across the second load capacitor.

17. The circuit of claim 10, wherein:
the capacitive sensing cell comprises a first sensor voltage node associated with the first sensing capacitor, a second sensor voltage node associated with the second sensing capacitor, and a common node shared by the first sensing capacitor and the second sensing capacitor;
the operational amplifier has an output node; and
when arranged in the initial capacitance-to-voltage configuration:
    the common node of the capacitive sensing cell is connected to the feedback node;
    an excitation voltage is applied to the first sensor voltage node;
    the reference voltage is applied to the common node and to the feedback node;
    analog ground is established at the second sensor voltage node;
    the first feedback capacitor is connected between the feedback node and the reference voltage;
    the second feedback capacitor is connected between the feedback node and the reference voltage;
    the inverting input node is connected to the output node;
    the first load capacitor is connected between the output node and the reference voltage; and
    the reference voltage is connected across the second load capacitor.

18. The circuit of claim 10, wherein:
the capacitive sensing cell comprises a first sensor voltage node associated with the first sensing capacitor, a second sensor voltage node associated with the second sensing capacitor, and a common node shared by the first sensing capacitor and the second sensing capacitor;
the operational amplifier has an output node; and
when arranged in the final capacitance-to-voltage configuration:
    the common node of the capacitive sensing cell is connected to the feedback node;
    analog ground is established at the first sensor voltage node;
    the reference voltage is applied to the second sensor voltage node;
    the first feedback capacitor is connected between the feedback node and the output node;
    the second feedback capacitor is connected between the feedback node and the reference voltage;
    the first load capacitor is connected between the output node and the reference voltage; and
    the reference voltage is connected across the second load capacitor.

19. The circuit of claim 10, wherein:
the capacitive sensing cell comprises a common node shared by the first sensing capacitor and the second sensing capacitor;
the operational amplifier has an output node; and
the capacitive sensing cell, the operational amplifier, the offset capacitor, the first feedback capacitor, the second feedback capacitor, the first load capacitor, and the second load capacitor are configurable in an initial amplification configuration in which:
    the common node of the capacitive sensing cell is disconnected from the feedback node;
    the first feedback capacitor is connected between the feedback node and the output node;
    the second feedback capacitor is connected between the feedback node and the reference voltage;
    the first load capacitor is connected between the feedback node and the reference voltage; and the second load capacitor is connected between the output node and the reference voltage.

20. The circuit of claim 10, wherein:
the capacitive sensing cell comprises a common node shared by the first sensing capacitor and the second sensing capacitor;
the operational amplifier has an output node; and
the capacitive sensing cell, the operational amplifier, the offset capacitor, the first feedback capacitor, the second feedback capacitor, the first load capacitor, and the second load capacitor are configurable in a final amplification configuration in which:
the common node of the capacitive sensing cell is disconnected from the feedback node;
an offset voltage is applied to the feedback node;
the second feedback capacitor is connected between the feedback node and the output node;
the reference voltage is connected across the first load capacitor; and
the second load capacitor is connected between the feedback node and the reference voltage.

* * * * *